United States Patent [19]
Yu

[11] Patent Number: 5,246,887
[45] Date of Patent: Sep. 21, 1993

[54] DIELECTRIC DEPOSITION

[75] Inventor: Chen-Hua D. Yu, Allentown, Pa.

[73] Assignee: AT&T Bell Laboratories, Murray Hill, N.J.

[21] Appl. No.: 727,698

[22] Filed: Jul. 10, 1991

[51] Int. Cl.$^5$ .................... H01L 21/00; H01L 21/02; H01L 21/20; H01L 21/205
[52] U.S. Cl. .................... 437/238; 437/235; 437/240; 148/DIG. 118
[58] Field of Search ............... 437/225, 235, 238, 240; 148/DIG. 118

[56] References Cited

U.S. PATENT DOCUMENTS

| | | | |
|---|---|---|---|
| 3,934,060 | 1/1976 | Burt et al. | 437/235 |
| 4,717,596 | 1/1988 | Barbee et al. | 437/238 |
| 4,872,947 | 10/1989 | Wang et al. | 437/235 |

*Primary Examiner*—Brian E. Hearn
*Assistant Examiner*—B. Everhart
*Attorney, Agent, or Firm*—John T. Rehberg

[57] ABSTRACT

A method for forming a thin high quality interlevel dielectric is disclosed. The dielectric is produced in a plasma reactor utilizing a precursor gas such as TEOS. Pressure, power, temperature, gas flow, and showerhead spacing are controlled so that a dielectric of TEOS may be deposited at 60-5 Å / sec, thus making formation of thin (800 Å) high quality dielectrics feasible.

13 Claims, 1 Drawing Sheet

DIELECTRIC DEPOSITION

TECHNICAL FIELD

This application relates generally to the manufacture of semiconductor integrated circuits and, more particularly, to methods for producing dielectric layers in such circuits.

BACKGROUND OF THE INVENTION

It is customary in the manufacture of integrated circuits, to form dielectric layers between conductors which interconnect various portions of the circuit. The conductive interconnections, known as "runners," may be made from a metal, such as aluminum or tungsten, or may be made from doped poly-silicon, perhaps with an overlaying layer of silicide. In some applications, the entire runner may be made from silicide.

It is sometimes desired, for example, in certain SRAM applications, to have a comparatively thin dielectric layer between the second- and the third-level conductors. One method for providing such an interlevel dielectric is to use low-pressure chemical vapor deposition (LPCVD) of silicon dioxide from an appropriate precursor gas, such as TEOS. However, the relatively high (approximately 720° C.) deposition temperature of LPCVD TEOS may cause degradation of silicided runners.

Plasma-enhanced TEOS processes (PETEOS) utilize a lower deposition temperature (approximately 390° C.), but are often too fast (i.e., deposit material too quickly) and produce material layers of uneven quality. Typical standard PETEOS processes can produce a comparatively thick (10,000 Å) dielectric film at a rate of approximately 125 Å per second. However, this deposition rate is too fast for situations in which a thin (approximately 1000 Å) or ultra-thin (approximately 100 Å) dielectric is desired because the deposition process is not completely stable in the first few seconds after startup.

SUMMARY OF THE INVENTION

Illustratively, the present invention provides a manufacturable process for depositing a thin layer of high quality, uniform dielectric in a reactor by utilizing a deposition rate which is slower than standard processes. Applicant has found that by reducing the ratio of precursor gas flow rate to oxygen flow rate, a dielectric with the aforementioned characteristics can be produced.

DETAILED DESCRIPTION

Figure 1:
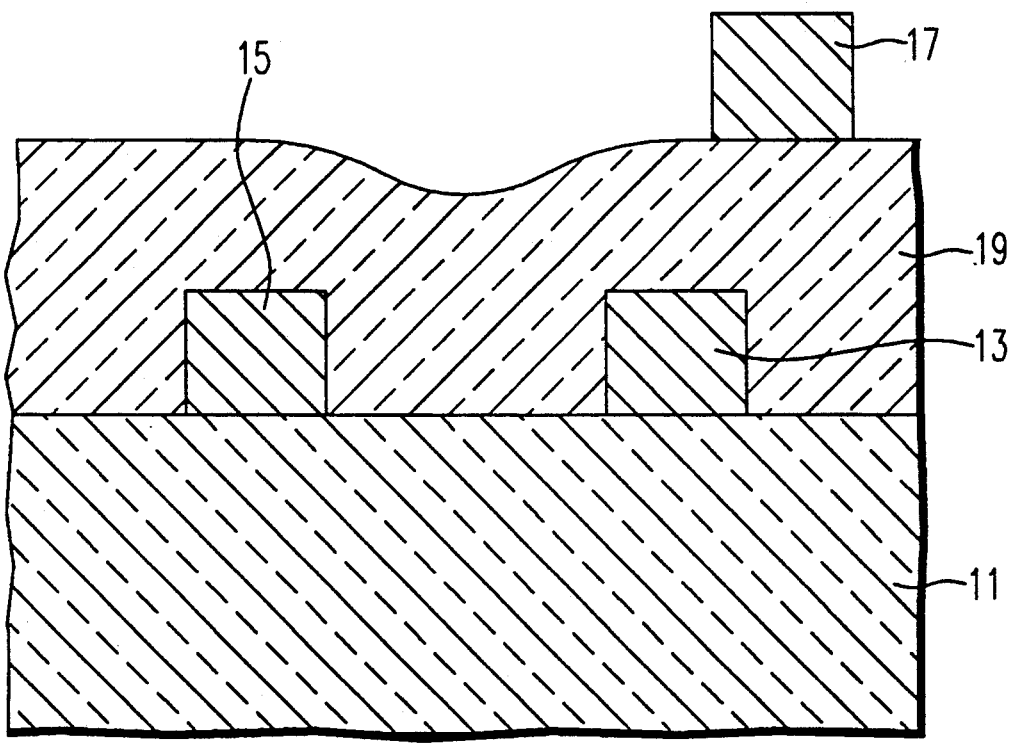
FIG. 1 is a cross-sectional view showing a portion of a product (e.g., a semiconductor integrated circuit) produced by an illustrative embodiment of the present invention.

Turning to FIG. 1, a semiconductor product is shown including runners 13, 15, and 17, and dielectric material 11 and 19. Dielectric material 11 may be formed by a conventional PECVD deposition process described in greater detail below. Typically, there may be located beneath dielectric 11 a body, a material which may include, for example, a silicon substrate, another dielectric layer, or both. Conductive runners 13 and 15 are formed upon dielectric layer 11. Runners 13 and 15 may be made from a metal, such as aluminum or tungsten, or may be made from doped polysilicon or amorphous silicon. Alternatively, runners 13 and 15 may be a silicide, such as titanium silicide. Runners 13 and 15 may be only partially silicide, i.e., only the upper portions of runners 13 and 15 may contain silicide, while the lower portions comprise polysilicon or amorphous silicon. Runners 13 and 15 may be connected to the active regions of transistors, such as sources, gates, or drains. Windows or vias through which the connections may be made are not depicted in the figure. Alternatively, runners 13 and 15 may be connected to other lower-level runners. Dielectric 19 covers and surrounds runners 13 and 15. Runner 17 is located atop dielectric layer 19. Runner 17 may be connected through vias or windows to lower runners, such as 13 or 15, through openings not illustrated. In many applications, it is desired that dielectric 19 be comparatively thin (e.g., approximately 800 Å). For example, a comparatively this dielectric may be used when runner 17 and runners 13 and 15 are at the same or nearly the same voltage which may occur, for example, in certain SRAM cells.

As mentioned before, formation of dielectric 19 by prior art LPCVD TEOS processes requires a temperature of approximately 720° C. The comparatively high temperature of 720° C. may cause degradation of any silicide material in runners 13 and 15.

Alternatively, dielectric 19 may be formed by a prior art PETEOS process. The PETEOS process requires a lower deposition temperature (approximately 390° C.). However, typical PETEOS processes are very fast— they may produce approximately 125 Å of material per second. Consequently, a mere 6 seconds, or so is required for deposition of approximately 800 Å of dielectric 19 thickness. Furthermore, when dielectric 19 is produced by PETEOS process, the resulting layer is often of uneven quality.

It is hypothesized that the uneven quality obtains because the plasma utilized to form layer 19 by the prior art PETEOS process does not become fully stabilized until approximately three or more seconds after initiation. Dielectric formed during the initial unstable phase of plasma creation has poor dielectric properties. However, if dielectric 19 is to be comparatively thin (i.e., 800 Å), it is essential that the dielectric should be of high quality. It is hypothesized that the dielectric layer formed during the first 3 seconds contains, in addition to silicon dioxide, impurities such as carbon and Si—OH.

Applicant has discovered processes for producing a comparatively uniform high-quality dielectric layer which is formed in a plasma-enhanced reaction using a precursor, such as TEOS. The deposition process is comparatively slower, i.e., 60–5 Å per second than conventional PETEOS deposition which is typically 125 Å /second. The inventive processes adapt well to deposition equipment, such as the AMI 5000, manufactured by Applied Materials Corporation, Santa Clara, Calif. Furthermore, the teachings of the present invention are also applicable to apparatus made by other manufacturers, such as Novellus.

Applicant's processes for producing a dielectric layer utilizing a precursor gas, such as TEOS, is detailed below in Table 1. The table includes three embodiments in columns A, B, and C. For comparison, conventional PETEOS process parameters are also listed in Table 1.

TABLE 1

| | A | B | C | Conventional Processes |
|---|---|---|---|---|
| Typical Thicknesses | 500–3000 Å | 200–600 Å | 50–200 Å | >10,000 Å |
| Pressure | 8 torr ± 10% | 6 torr ± 10% | 6–8 torr | 9 torr |
| Power | 350 w ± 10% | 100–200 w | 200–300 w | 350 w |
| TEOS flow | 200 sccm ± 10% | 100 sccm ± 10% | 50 sccm ± 10% | 380 sccm |
| $O_2$ flow | 600 sccm ± 10% | 700 sccm ± 10% | 750 sccm ± 10% | 425 sccm |
| Suscept. Temp. | >390–410° C. | >390–410° C. | >390–410° C. | 390° C. |
| Spacing | 200–300 mil | 300 mil ± 10% | 300 mil ± 10% | 190 mil |
| Deposition Rate | 50–60 Å/min. | 20–30 Å/sec. | 5–10 Å/sec. | 125 Å/sec. |
| Uniformity (1σ) | ±3% | ±2% | ±7% | ±3% |

Applicant hypothesizes that the deposition process involving a precursor, such as TEOS, involves two types of reactions: (1) a gas-phase reaction in the plasma and (2) a surface reaction upon the substrate. In the gas-phase reaction, TEOS and oxygen combine in the plasma. Oxygen radicals assist in the dissociation of TEOS and the burning-off of carbon and helium carrier-gas. The surface reaction may be described as providing a final landing place for silicon dioxide species where they may combine and form bonds. Furthermore, the surface reaction permits the desorption of undesirable species, such as carbon, silicon carbides, and Si—OH.

Applicant's process (especially for embodiments A and C) provides for an increase in the ratio of total plasma power to TEOS flow rate. The increased power makes the gas-phase reaction more efficient and provides for the "burning off" of undesired species. Furthermore, applicant's process provides for an increase in the oxygen to TEOS flow rate ratio. Naturally, one might expect to decrease the amount of TEOS if a slower deposition rate were desired. However, the decreased TEOS flow also means that undesirable carbonaceous materials inherent in the TEOS chemistry are provided to the reaction more slowly. Thus, the undesired materials may be more efficiently burned off, thus enhancing the quality of the deposited dielectric. It should be noted that in all three embodiments the total gas flow (TEOS plus oxygen) is approximately constant (carrier gas, such as helium, is not considered). One might be tempted to simply decrease both TEOS and oxygen in order to get a lower deposition rate. However, the resulting layer has been found to be not uniform. Alternatively, one might be tempted to decrease the flow of both gases and add an inert gas such as argon to maintain a total gas flow near 800 sccm. However, the argon may be incorporated in the resulting layer and degrade its properties.

The increased ratio of oxygen flow rate to TEOS flow rate is believed by applicant to be one of the most significant changes from standard process parameters for producing the desired layers. Thus, in a standard process, the ratio of TEOS flow rate to oxygen flow rate is approximately 425/380=1.1, whereas, the same ratio for applicant's process is no higher than $$\frac{600 - 10\%}{200 + 10\%} = \frac{540}{220} \approx 2.4.$$

Furthermore, in applicant's process, the temperature of the substrate is slightly increased. A temperature increase to approximately 400°–410° C. is not generally significant in LPCVD reactions. However, the temperature increase is significant in PETEOS reactions. The increased temperature has been found to assist in converting Si—O to silicon dioxide. Furthermore, the increased temperature enhances the desorption reaction which facilitates elimination of Si—OH and carbonaceous materials. Applicant's process is also characterized by an increased wafer-to-showerhead spacing. (The showerhead is the multi-hole apparatus through which the TEOS, oxygen and carrier gas are dispensed.) The increased wafer-to-showerhead spacing means that species arriving at the substrate surface are less likely to contain undesired by-products of the TEOS dissociation.

Examination of Table 1 shows that the thickness uniformity of at least embodiments A and B is comparable to conventional processes. Such uniformity enhances manufacturability of the process. The somewhat poorer uniformity of embodiment C may be due to the presence of native oxide (of uneven thickness) which becomes a more significant part of the resulting oxide than in other embodiments. The present invention is applicable to the formation of dielectrics, not only between conductive runners, but also between active transistor regions and first-level runners. Furthermore, the inventive principles are applicable to deposition of dielectrics from other precursors such as tetramethylcyclotetrasiloxane ($C_4H_{16}Si_4O_4$) with the acronym "TMCTS," sold under the trademark "TOMCATS" by J. C. Schumacher, a unit of Air Products and Chemicals, Inc.

I claim:

1. A method of semiconductor integrated circuit fabrication comprising:

depositing first and second dielectrics upon a substrate, each of said dielectrics being deposited in a plasma reactor utilizing a respective precursor gas and respective oxygen, said respective precursor gas and said respective oxygen having respective flow rates;

said respective precursor gases and said respective oxygen being directed at said substrate through one or more showerheads located a respective predetermined distance from said substrate;

said plasmas being characterized by total respective power;

said substrate being positioned on a susceptor which is characterized by a respective temperature; and said reactor being characterized by a respective total pressure and characterized by:

the ratio of said oxygen gas flow to said precursor flow for said second dielectric being greater than the ratio of said oxygen gas flow to said precursor gas flow for said first dielectric, thereby depositing said second dielectric at a lower rate than said first dielectric.

2. The method of claim 1 in which the said respective total pressure of said reactor for said second dielectric is less than the said respective total pressure of said reactor for said first dielectric.

3. The method of claim 1 in which the said respective temperature of said susceptor for said second dielectric is greater than the said respective temperature of said susceptor for said first dielectric.

4. The method of claim 1 in which the said respective power of said plasma for said second dielectric is less than the said respective power of said plasma for said first dielectric.

5. The method of claim 1 in which said ratio of oxygen gas flow to said precursor gas flow for said second dielectric is greater than approximately 2.4.

6. The method of claim 1 in which the pressure inside said reactor during deposition of said second dielectric is chosen from the group consisting of the ranges 8 Torr±10%, 6 Torr±10%, and 6-8 Torr.

7. The method of claim 1 in which said plasma utilized for the deposition of said second dielectric is characterized by a total power and said power is chosen from the group consisting of 350 watts±10%, 100-200 watts, and 200-300 watts.

8. The method of claim 1 in which said precursor gas utilized during the formation of said second dielectric is TEOS.

9. The method of claim 8 in which said TEOS flow rate is chosen from the group consisting of 200 sccm±10%, 100 sccm±10%, and 50 sccm±10%.

10. The method of claim 8 in which said oxygen flow rate utilized during the formation of said second dielectric is chosen from the group consisting of 600 sccm±10%, 700 sccm±10%, and 750 sccm±10%.

11. The method of claim 1 in which said substrate is positioned on a susceptor during the formation of said second dielectric and said susceptor temperature is greater than 390° C. and less than 410° C.

12. The method of claim 1 in which the distance between said showerhead and said susceptor during the formation of said second dielectric is chosen from the group consisting of 200-300 mils and 300 mils±10%.

13. The method of claim 1 in which said precursor gas utilized during the formation of said second dielectric is TMCTS.

* * * * *